US008231852B2

(12) United States Patent
Itou et al.

(10) Patent No.: US 8,231,852 B2
(45) Date of Patent: Jul. 31, 2012

(54) SILICON WAFER AND METHOD FOR PRODUCING THE SAME

(75) Inventors: Wataru Itou, Tokyo (JP); Takashi Nakayama, Tokyo (JP); Shigeru Umeno, Tokyo (JP); Hiroaki Taguchi, Tokyo (JP); Yasuo Koike, Tokyo (JP)

(73) Assignee: Sumco Corporation, Tokyo (JP)

( * ) Notice: Subject to any disclaimer, the term of this patent is extended or adjusted under 35 U.S.C. 154(b) by 82 days.

(21) Appl. No.: 12/779,968

(22) Filed: May 14, 2010

(65) Prior Publication Data

US 2010/0290971 A1 Nov. 18, 2010

(30) Foreign Application Priority Data

May 15, 2009 (JP) ................................. 2009-118533

(51) Int. Cl.
*C01B 33/02* (2006.01)
*H01L 21/00* (2006.01)
(52) U.S. Cl. ........................................ 423/348; 438/795
(58) Field of Classification Search .......... 423/348–350; 438/795–799
See application file for complete search history.

(56) References Cited

U.S. PATENT DOCUMENTS

| 6,143,071 | A  | * | 11/2000 | Aihara et al. ................ 117/89 |
| 6,264,906 | B1 | * | 7/2001  | Aihara et al. .............. 423/328.2 |
| 6,436,846 | B1 | * | 8/2002  | Tews et al. .................... 438/770 |
| 6,743,495 | B2 | * | 6/2004  | Vasat et al. ................... 428/64.1 |
| 6,803,331 | B2 | * | 10/2004 | Holzl et al. ................... 438/795 |
| 6,897,084 | B2 | * | 5/2005  | Binns et al. .................... 438/58 |
| 7,135,351 | B2 | * | 11/2006 | Binns et al. .................... 438/58 |
| 2002/0000185 | A1 | * | 1/2002 | Falster ............................ 117/2 |
| 2002/0189528 | A1 | * | 12/2002 | Falster ........................... 117/20 |
| 2005/0032376 | A1 | * | 2/2005 | Seuring et al. ................ 438/689 |
| 2010/0105191 | A1 | * | 4/2010 | Hayamizu et al. ........... 438/476 |

FOREIGN PATENT DOCUMENTS

| JP | 2003-297840 | 10/2003 |
| JP | 2004-111732 | 4/2004 |
| JP | 2006-344823 | 12/2006 |
| JP | 2008-207991 | 9/2008 |
| KR | 10-2004-0058940 | 7/2004 |
| KR | 10-0560952 | 3/2006 |
| KR | 10-2010-0014191 | 2/2010 |
| KR | 10-1020436 | 3/2011 |

* cited by examiner

*Primary Examiner* — Stanley Silverman
*Assistant Examiner* — Anthony J Zimmer
(74) *Attorney, Agent, or Firm* — Clark & Brody

(57) ABSTRACT

It is possible to provide a silicon wafer that as well as being free of COPs and dislocation clusters, has defects (grown-in defects including silicon oxides), which are not overt in an as-grown state, such as OSF nuclei and oxygen precipitate nuclei existing in the PV region, to be vanished or reduced, by adopting a method for producing a silicon wafer, the method comprising the steps of: growing a single crystal silicon ingot by the Czochralski method; cutting a silicon wafer out of the ingot; subjecting the wafer to an RTP at 1,250° C. or more for 10 seconds or more in an oxidizing atmosphere; and removing a grown-in defect region including silicon oxides in the vicinity of wafer surface layer after the RTP.

6 Claims, 3 Drawing Sheets

SILICON WAFER AND METHOD FOR PRODUCING THE SAME

BACKGROUND OF THE INVENTION

1. Field of the Invention

The present invention relates to a silicon wafer grown by the Czochralski method and suitably used for a substrate of a semiconductor device, etc. and also to a method for producing the same.

2. Description of the Related Art

A silicon wafer used as a substrate of a semiconductor device is produced as follows: a wafer is cut out of a single crystal silicon ingot which is generally grown by the Czochralski method (hereinafter, called the "CZ method") and subjected to the steps such as polishing. The CZ method is a method for growing a single crystal including the steps of: dipping a seed crystal in silicon melted in a quartz crucible and pulling the seed crystal. The crystal grown by this method usually includes crystal defects called grown-in defects.

FIG. 1 is a longitudinal sectional view of a pulled single crystal and also a diagram schematically showing one example of the relationship between defect distribution and V/G. V is the pulling rate of a single crystal silicon and G is the temperature gradient in the growth direction in the single crystal immediately after pulled. The above-mentioned temperature gradient G is considered to be generally constant due to a thermal characteristic of the hot zone structure of the CZ furnace, so that V/G can be controlled by adjusting the pulling rate V. The single crystal is grown while gradually lowering V/G. And the crystal is sectioned along the central axis thereof, Cu is deposited onto its section, and heat treatment is applied to the section. This drawing schematically shows the section, after above treatment, observed by X-ray topography (FIGS. 2 and 4 to be hereinafter described were also made by a similar method).

In FIG. 1, crystal originated particles (COPs) are an aggregate of vacancies (micro voids) as being devoid of atoms that make up of crystal lattices during single crystal growth, and a dislocation cluster is an aggregate of interstitial silicon excessively taken into interstices. If COPs existing in the vicinity of the wafer surface are taken into an oxide film during the thermal oxidation of the wafer surface, gate oxide integrity (GOI) characteristics of the semiconductor device are degraded. In addition, the dislocation cluster becomes causes of device characteristics defective. In other words, COPs and dislocation cluster exert an adverse influence on the device characteristics. Therefore, the research and development have been carried out for obtaining a silicon wafer free of these grown-in defects.

As shown in FIG. 1, when V/G is large (the pulling rate is fast), excessive vacancies exist and COPs are introduced into the single crystal, while when V/G is small (the pulling rate is slow), an excessive amount of interstitial silicon exist, the dislocation cluster is likely to be generated. In the growth of a single crystal silicon, since a faster pulling rate is typically employed to increase V/G for improving the productivity, etc., the wafer obtained from the pulled single crystal intrinsically contains COPs.

In order to remove such COPs introduced during growing the single crystal as described above, for example, Japanese Patent Application Publication No. 2006-344823 proposes a method of producing a silicon wafer that includes the steps of: cutting wafers out of a silicon ingot as being grown by the CZ method and having a low interstitial oxygen concentration ($7.0 \times 10^{17}$ atoms/cm$^3$ or less); and annealing the cut-out wafer in an oxidation atmosphere, thereby vanishing COPs. In this method, the resistivity is homogenized by resorting to measures such as irradiating the silicon ingot with neutrons to convert part of the silicon atoms into phosphorous atoms, so that the resulting wafer can be suitably used for a substrate of an insulated gate bipolar transistor (IGBT).

Moreover, Japanese Patent Application Publication No. 2003-297840 discloses a method of heat treatment in which a wafer having an oxygen concentration of less than $7 \times 10^{17}$ atoms/cm$^3$ is used, the heating temperature is selected such that the concentration of oxygen in equilibrium with the oxide film on the surface of COP exceeds the concentration of oxygen atoms dissolved in the interstices under an atmosphere containing oxygen, and the temperature of the wafer is rapidly increased to the selected temperature and kept for a specified time, followed by cooling. As a result, the oxide film on the COP surface is vanished due to the diffusion of the oxygen atoms into the crystal lattices. After the vanishment of the film, the COPs are vanished because of the diffusion of the vacancies or the interstitial silicon atoms. The outward diffusion of oxygen on the wafer surface does not count, and the diffusion of oxygen atoms at such a high temperature as causing the interstitial oxygen to be unsaturated gets the oxide film on the COP surface to be extinguished, so that COPs are vanished for a region more than at least 50% of a wafer thickness.

However, in the method of heat treatment described in Japanese Patent Application Publication No. 2003-297840, it is difficult to completely vanish the COPs existing in the inside of the wafer (bulk) by oxidation heat treatment, requiring a long period of time for the heat treatment, and consequently posing the problem of an increase in production cost. In addition, a wafer having a very low oxygen concentration has to be used, and thus the mechanical strength is low, thereby also causing the problem of generating slip dislocations in the wafer during the oxidation heat treatment at high temperature, or the like.

Along with the miniaturization and higher performance of devices in recent years, it has been clarified that even the existence of very micro COPs in active areas of the device of a wafer exerts an adverse influence on device characteristics such as lowering insulation properties of the gate oxide film (gate oxide breakdown voltage). Hence, the COPs within a wafer should be completely vanished.

In the method described in Japanese Patent Application Publication No. 2003-297840 mentioned above, in order to completely vanish the COPs, any one or the combination of measures of: (a) reducing the oxygen concentration to less than $7 \times 10^{17}$ atoms/cm$^3$; (b) increasing the heat treatment temperature; and (c) prolonging heat treatment time, needs to be used, however, either the pulling of a low oxygen single crystal, high temperature heat treatment, or heat treatment for a long period of time increases production cost. In the method of producing a silicon wafer described in above-mentioned Japanese Patent Application Publication No. 2006-344823 also, the production cost is also increased since a silicon ingot of an interstitial oxygen concentration of $7 \times 10^{17}$ atoms/cm$^3$ is used as a starting material.

This problem can be solved if a wafer is used that consists of defect-free regions that do not include COPs and dislocation clusters from the surface layer of the wafer to the entire bulk thereof. If a single crystal entirely consisting of the defect-free regions that do not include COPs or dislocation clusters is pulled up, such a wafer can be produced by cutting out of the single crystal and subjecting to necessary processing.

Such a single crystal entirely consisting of defect-free regions that do not include COPs and dislocation clusters is produced by pulling the single crystal while properly controlling the ratio (V/G) of the pulling rate V of the single crystal silicon to the temperature gradient G in the growth direction within the single crystal immediately after pulled. That is, in FIG. 1, COPs and dislocation clusters are prohibited from being introduced into the single crystal by adjusting pulling rate of the single crystal such that the V/G be controlled to be between the value corresponding to the position of symbol A and the value corresponding to the position of symbol B.

FIG. 2 is a drawing schematically showing one example of the transverse section of a pulled single crystal silicon. The drawing shows a wafer cut out of the single crystal grown such that V/G is controlled to be the value corresponding to the position of symbol C between symbol A and symbol B indicated in FIG. 1. As shown in FIG. 2, there is an OSF region at the center of the wafer, and a PV region and PI region successively exist outside the OSF region.

These regions locate between a territory including COPs as being an aggregate of vacancies and a territory including dislocation clusters as being an aggregate of interstitial silicon, and are the defect-free regions where the number of vacancies and the number of interstitial silicon are balanced to be easily united and vanished. The PV region is near the territory including COPs as being an aggregate of vacancies and is a defect-free region where vacancy-type point defects are dominant. The PI region is near the region including dislocation clusters and is a defect-free region where interstitial silicon-type point defects are dominant.

However, even such a wafer consisting of the defect-free regions that do not include COPs or dislocation clusters is not a perfect defect-free wafer. In the defect-free regions, the OSF region is adjacent to the region where COPs occur, and includes plate-like oxygen precipitates (OSF nuclei) in an as-grown condition. Hence, when the wafer is subjected to oxidation heat treatment at a high temperature (generally, from 1,000 to 1,200° C.), the OSF nuclei turn fat and overt as oxidation induced stacking faults (OSFs). Moreover, the PV region includes oxygen precipitation nuclei in the as-grown state, and if the wafer is subjected to heat treatment comprising two stages at low and high temperatures (e.g., 800° C. and 1,000° C.), oxygen precipitates are easily generated. The PI region substantially does not include oxygen precipitation nuclei in the as-grown state, and is a region in which oxygen precipitates are not easily generated even after the heat treatment.

The defects existing in the OSF region and PV region are not overt in the as-grown state, and are generated if they are subjected to the heat treatment or the like under specific conditions. However, the defects existing in the OSF region and PV region in addition to the above-described very micro COPs exert an influence on devices in terms of yield, which now cannot be ignored. For instance, it is well-known that, if the OSFs generated under the thermal oxidization at a high temperature are generated on the surface of the wafer and grown, the OSFs cause a leakage current to deteriorate the device characteristic. Additionally, the oxygen precipitate nuclei included in the PV region generate oxygen precipitates in the heat treatment in the process of device processings, and if the precipitates are left in the active layer of elements making up of the device, a leakage current might be occurred in the device.

SUMMARY OF THE INVENTION

The object of the present invention is to provide a silicon wafer, as well as being free of COPs or dislocation clusters, in which so-called latent defects, not overt in an as-grown state, such as plate-like oxygen precipitates (OSF nuclei) existing in an OSF region and oxygen precipitate nuclei existing in a PV region, are vanished or reduced, and is to provide the method for producing the same.

To achieve the above-mentioned object, the present inventors have first studied a method of evaluating the existence of the plate-like oxygen precipitates (OSF nuclei) existing in the OSF region and the oxygen precipitate nuclei existing in the PV region (i.e., defects that turn overt in the heat treatment process or the like in the device fabrication process and may exert an adverse influence on the characteristics of the device). As a result, it has been ascertained that, by applying reactive ion etching (RIE) to a silicon wafer in the as-grown state, plate-like oxygen precipitates (OSF nuclei) existing in the OSF region and oxygen precipitate nuclei existing in the Pv region become overt as protrusions on the etched surface. The defects which become overt on the wafer surface by the RIE is hereinafter called "grown-in defects including silicon oxide".

The RIE is a kind of dry etching that uses gas, and leads generated plasma by high-frequency discharge or the like to a wafer surface to react with the surface, and thereby generating volatile substances and removing them. Since the wafer is maintained negative potential, ions in plasma collide with the wafer surface to eject atoms. When a gas containing a halogen gas (Br, Cl, F) having a large selectivity of oxide (silicon oxide) is used, the silicon is selectively etched and the oxide is exposed on the wafer surface as a conical etching residue, so it is detected as a crystal defect.

Thus, the present inventors attempted to vanish grown-in defects including silicon oxide by applying rapid thermal processing (hereinafter called "RTP") to the silicon wafer including grown-in defects including silicon oxide, i.e., the plate-like oxygen precipitates (OSF nuclei) in the OSF region and the oxygen precipitate nuclei in the PV region, in an oxygen atmosphere. This is because the above-mentioned plate-like oxygen precipitates (OSF nuclei) and oxygen precipitate nuclei are present in the form of silicon oxides, so it is considered that the dissolution of the oxides into the silicon (solid solution) can be promoted by heating the wafer at a high temperature in an oxidizing atmosphere.

The application of the RTP can greatly shorten the time required for temperature rise and temperature fall and also can reduce the total heat amount applied to the silicon wafer. In the study, a lamp anneal furnace which heats with a halogen lamp was used.

As a result of the study, it has been turned out that, by applying the RTP at 1,250° C. or higher in an oxidizing atmosphere, the defects such as plate-like oxygen precipitates (OSF nuclei) in the OSF region and the oxygen precipitate nuclei in the PV region can be vanished even in the inside of the wafer. However, it has been ascertained that the grown-in defects including silicon oxides are left in the vicinity of the wafer surface after the RTP.

The present invention was made on the basis of such study result, and the subject matters of the present invention include a method of producing a silicon wafer described in (1) below and a silicon wafer produced by the above method and described in (2) below.

(1) A method for producing a silicon wafer, comprising the steps of: growing a single crystal silicon ingot by the CZ method; cutting a silicon wafer out of the single crystal silicon ingot; subjecting the silicon wafer to an RTP at 1,250° C. or more for 10 seconds or more in an oxidizing atmosphere; and removing a grown-in defect region including silicon oxides in the vicinity of wafer surface layer after the RTP.

In the method for producing a silicon wafer of the present invention, when a single crystal silicon ingot consisting of defect-free regions as being free of COPs or dislocation clusters is grown in the growing step, a wafer can be stably produced that contains extremely few crystal defects, including grown-in defects with silicon oxides which become overt on the wafer surface by reactive ion etching.

In the method for producing a silicon wafer of the present invention, the density of grown-in defects including silicon oxides is preferably reduced to $1\times10^6$ defects/cm$^3$ or less in the entire region in a thickness-wise direction of the silicon wafer. Alternatively, when being not in the entire region in a thickness-wise direction of the wafer, but within the range in depth between the surface of the silicon wafer and a depth of 10 μm from the surface, which is typically used as the device active region, the density of the above grown-in defects including silicon oxides may be reduced to $1\times10^6$ defects/cm$^3$ or less.

In the method for producing a silicon wafer of the present invention, if the interstitial oxygen concentration of the silicon wafer before the RTP performed in an oxidizing atmosphere is set in the range of $8\times10^{17}$ to $20\times10^{17}$ atoms/cm$^3$, the grown-in defects including silicon oxides can be reduced and the mechanical strength of the wafer itself can be also improved to thereby prevent the generation of slip dislocation and the like. Specifically, it is preferable that the above-mentioned interstitial oxygen concentration is particularly set in the range of $8\times10^{17}$ to $14\times10^{17}$ atoms/cm$^3$, since the grown-in defects including silicon oxides can be assuredly reduced. The "oxygen concentration" stipulated in the present invention is a value measured by Fourier transform infrared spectrophotometry stipulated in ASTM F-121 (1979).

(2) A silicon wafer cut out of a single crystal silicon ingot grown by the CZ method, wherein grown-in defects including silicon oxides are reduced.

It is preferable that the silicon wafer cut out of the above single crystal silicon ingot consists of the defect-free regions as being free of COPs and dislocation clusters. In this case the silicon wafer of the present invention has extremely few crystal defects, including the grown-in defects having silicon oxides.

In the silicon wafer of the present invention, if the density of the grown-in defects including silicon oxides is $1\times10^6$ defects/cm$^3$ or less in the entire region in a thickness-wise direction of the silicon wafer, the grown-in defects exert little adverse influence on the device characteristics, regardless of the depth from the surface of the wafer. Alternatively, not in the entire region in a thickness-wise direction of the wafer, but within the range between the surface of the silicon wafer and a depth of 10 μm from the surface, the density of the grown-in defects including silicon oxides is $1\times10^6$ defects/cm$^3$ or less. In this case, the grown-in defects exert little adverse influence on the device characteristics for the range in depth typically used as the device active area.

If the silicon wafer of the present invention has the interstitial oxygen concentration in the range of $8\times10^{17}$ to $20\times10^{17}$ atoms/cm$^3$, the grown-in defects including silicon oxides are few, and the mechanical strength of the wafer is excellent. It is more preferable that the oxygen concentration is particularly in the range of $8\times10^{17}$ to $14\times10^{17}$ atoms/cm$^3$. In this case, there is no risk that the grown-in defects may be left, thus assuring fully reducing them.

Although, the grown-in defects including silicon oxides are vanished in the entire region in a thickness-wise direction of the silicon wafer of the present invention, the silicon wafer has sufficient oxygen concentration. Therefore, when the DZ-IG processing is applied in a device step, a defect-free region is formed in a wafer surface layer and the BMD functioning as a gettering site is formed in the bulk.

According to the method for producing a silicon wafer of the present invention, it is possible to produce a silicon wafer that, as well as being free of COPs and dislocation clusters, has the grown-in defects including silicon oxides, which are not overt in an as-grown state, such as the plate-like oxygen precipitates (OSF nuclei) existing in the OSF region and the oxygen precipitate nuclei existing in the PV region, to be vanished or reduced.

In the silicon wafer of the present invention, the grown-in defects including silicon oxides are vanished or reduced. And the silicon wafer can be produced by the method of production of the present invention. This silicon wafer may not exert an adverse influence such as a device characteristic defective of a semiconductor device when the silicon wafer is used as a substrate of the device. Therefore, the silicon wafer is suitable for a substrate of a device and the like.

DETAILED DESCRIPTION OF THE PREFERRED EMBODIMENTS

A method for producing a silicon wafer according to the present invention includes the steps of: growing a single crystal silicon ingot by the CZ method; cutting a silicon wafer out of the single crystal silicon ingot; subjecting the silicon wafer to an RTP at 1,250° C. or more for 10 seconds or more in an oxidizing atmosphere; and removing a grown-in defect region including silicon oxides in the vicinity of wafer surface layer after the RTP. Hereinafter, each step will be set forth in detail.

(a) Step of Growing Single Crystal Silicon Ingot

This step is for growing a single crystal silicon ingot by the CZ method. During growing, it is preferable to use a single crystal pulling apparatus comprising a hot zone structure configured to properly control the temperature gradient in the growth direction within single crystal immediately after pulled.

Figure 1:
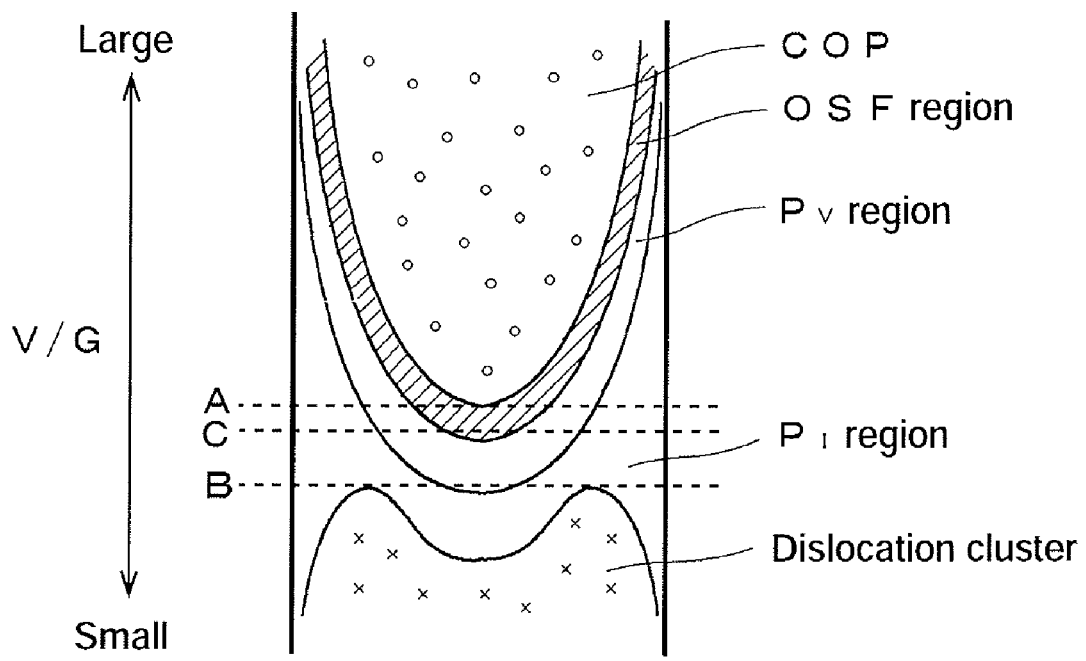
FIG. 1 is a longitudinal sectional view schematically showing one example of the relationship between the defect distribution and V/G in a pulled single crystal silicon.
Figure 2:
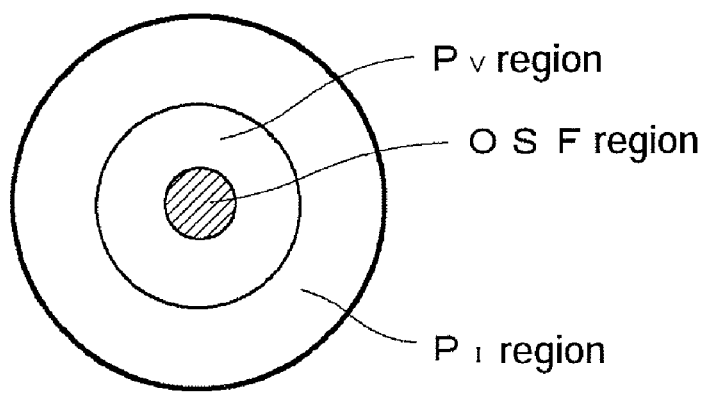
FIG. 2 is a drawing schematically showing one example of the transverse section of the pulled single crystal silicon.
Figure 3:
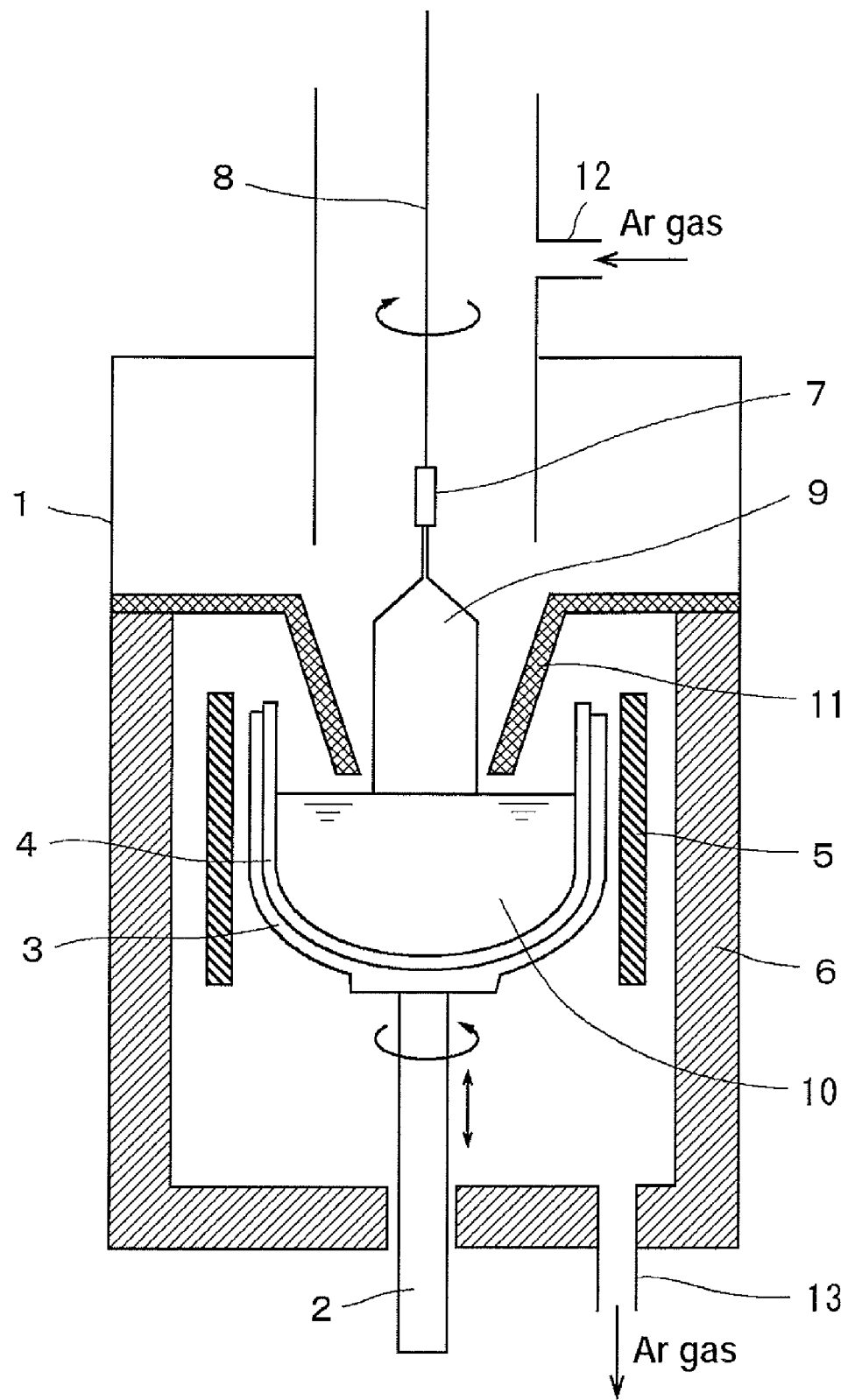
FIG. 3 is a diagram schematically showing one example of a rough configuration of the main part of a pulling apparatus suitable for growing a single crystal silicon used for the production of a silicon wafer of the present invention.

FIG. 3 is a diagram schematically showing one example of the rough configuration of the main part of a pulling apparatus suitable for growing a single crystal silicon used for the production of a silicon wafer of the present invention. As illustrated in the drawing, the pulling apparatus includes a chamber 1, an elevatable and rotatable support shaft 2 penetrating through the bottom center of the chamber 1 and disposed vertically upward, a graphite susceptor 3 fixed to the top end of the support shaft 2, a quartz crucible 4 housed in the graphite susceptor 3, a heater 5 disposed around the graphite susceptor 3, and a heat insulator 6. A seed chuck 7 holding a seed crystal, and a pulling wire 8 for hanging and pulling the seed chuck 7 are provided along the central axis of the quartz crucible 4. In addition, a heat shield member 11 is disposed not only for preventing the heating of a single crystal silicon ingot 9 caused by the radiant heat from the heater 5 and quartz crucible 4 but also for controlling the temperature fluctuation of a silicon melt 10.

A gas inlet 12 for introducing Ar gas into the chamber 1 is provided above the chamber 1. A gas outlet 13 for discharging Ar gas is disposed at the bottom of the chamber 1.

With using such a pulling apparatus configured as above, first, a silicon raw material is fed into the quartz crucible 4 and heated by the heater 5 in an Ar gas atmosphere to form a silicon melt 10. Next, the seed crystal held by the seed chuck 7 is dipped in the silicon melt 10 and gradually pulled up while rotating the seed crystal and quartz crucible 4 to grow the single crystal. In pulling, the ratio of the pulling rate to the temperature gradient in the growth direction within the single crystal immediately after pulled is properly controlled. This makes it possible to grow the single crystal silicon ingot 9 used in the production of the silicon wafer of the present invention.

In this growing step, if a single crystal silicon ingot free of COPs and dislocation clusters is grown, a wafer containing extremely few crystal defects can be produced because a single crystal consisting of defect-free regions is used as a starting material.

A single crystal silicon ingot consisting of defect-free regions as being free of COPs and dislocation clusters can be produced from the pulling apparatus with an improved structure of a hot zone comprising graphite susceptor 3, heater 5, heat insulator 6, and heat shield member 11 so as to adjust the radial distribution of the temperature gradient G in the growth direction within a single crystal immediately after pulled in the step of growing the single crystal.

Typically, a single crystal immediately after pulled is cooled due to heat diffusion from its surface, thereby the temperature gradient G in the growth direction within the single crystal immediately after pulled is large in the crystal periphery portion and small in the crystal central portion. On the other hand, when the hot zone structure is improved and the above temperature gradient G is made smaller in the crystal periphery portion than in the crystal central portion, the distribution of defects becomes substantially equal in a radial direction.

Figure 4:
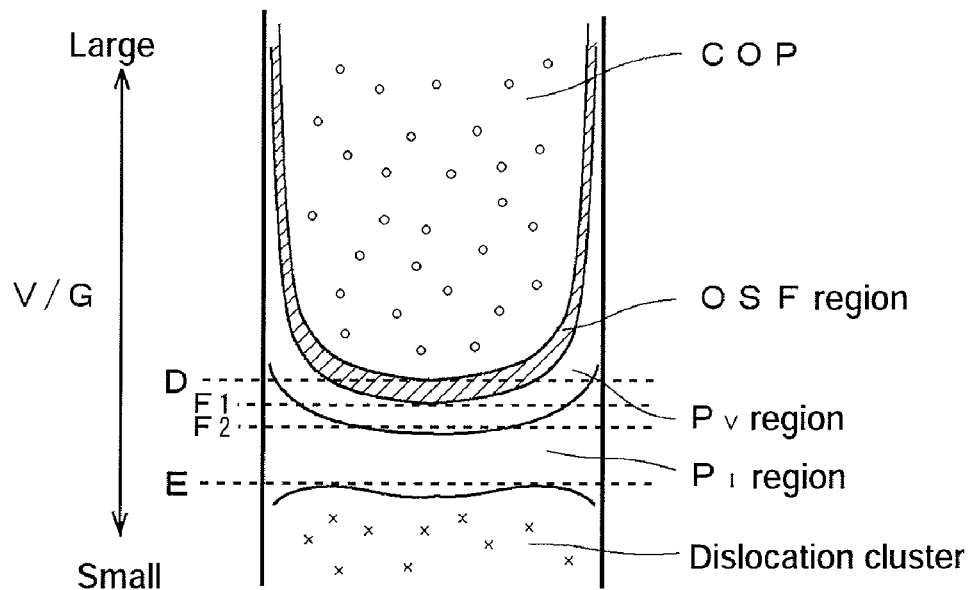
FIG. 4 is a longitudinal sectional view of a single crystal pulled by a pulling apparatus having a hot zone structure such that the temperature gradient in a growth direction within a single crystal silicon immediately after pulled is smaller in the crystal periphery portion than in the crystal central portion, and is also a diagram schematically showing one example of the relationship between defect distribution and V/G.

FIG. 4 is a longitudinal sectional view of a single crystal pulled by a pulling apparatus having a hot zone structure such that the temperature gradient in a growth direction within a single crystal silicon immediately after pulled is smaller in the crystal periphery portion than in the crystal central portion, and is also a diagram schematically showing one example of the relationship between defect distribution and V/G.

As shown in FIG. 4, a single crystal silicon ingot consisting of defect-free regions as being free of COPs and dislocation clusters can be obtained by adjusting the pulling rate of a single crystal to control V/G such that V/G be in the range between a value corresponding to the position of symbol D and a value corresponding to the position of symbol E. Since regions of similar characteristics are extended in a radial direction, the allowable range of the pulling rate V that can control V/G properly (that is, the range between above symbol D and symbol E) becomes large. Therefore, a wafer with extremely few crystal defects can be produced stably.

In addition, if V/G is controlled such that it is in the range between a value corresponding to the position of symbol F1 and the value corresponding to the position of symbol E (e.g., a value corresponding to the position of symbol F2), it becomes possible to obtain a single crystal silicon ingot free of COPs, dislocation clusters and an OSF region, but consisting of only a PV region and PI region. In this case, the PV region exists near the central portion of the wafer, and the PI region exists in the entire area outside the PV region.

(b) Step of Cutting Silicon Wafer Out

This step is for cutting a silicon wafer out of the above single crystal silicon ingot. In this step, typically, the ingot is cut into several blocks of a constant resistance range and then processed into a wafer through slicing, lapping, chemical etching, mirror polishing and other processing. Each processing may be performed according to the methods that are conventionally carried out.

(c) Heat Treatment Step Including RTP

This step is for performing an RTP at 1250° C. or more for 10 seconds or more in an oxidizing atmosphere, for the above silicon wafer.

The reason why the RTP is carried out in an oxidizing atmosphere is that defects such as a plate-like oxygen precipitate (OSF nuclei) present in the OSF region and oxygen precipitate nuclei present in the PV region can be vanished or reduced. The action and effect of the RTP will be described in the following.

Typically, a single crystal silicon grown by the CZ method includes about $10^{18}$ atoms/cm$^3$ of oxygen as impurities. Although oxygen dissolves into the crystal lattice in the form of solid solution around the melting point of silicon, part of oxygen is to precipitate as silicon oxides ($SiO_2$) in a wafer cut out of a single crystal silicon to form crystal defects such as OSF nuclei or oxygen precipitate nuclei in the PV region.

When the RTP is applied to this wafer in an oxidizing atmosphere, the silicon oxides within the crystal defects inside the wafer is vanished by the migration of the oxygen atoms of the silicon oxide into the crystal lattices. After the silicon oxides vanish, vacancies remain. The RTP is performed in an oxidizing atmosphere, so that interstitial silicon is poured into the wafer surface so as to bury the vacancies. This series of processes is recognized as a dissolution (solid solution) phenomenon. As a result, grown-in defects including silicon oxides such as OSF nuclei and oxygen precipitate nuclei in the PV region are vanished or reduced. When very micro COPs are included, they are also vanished or reduced.

Figure 5:
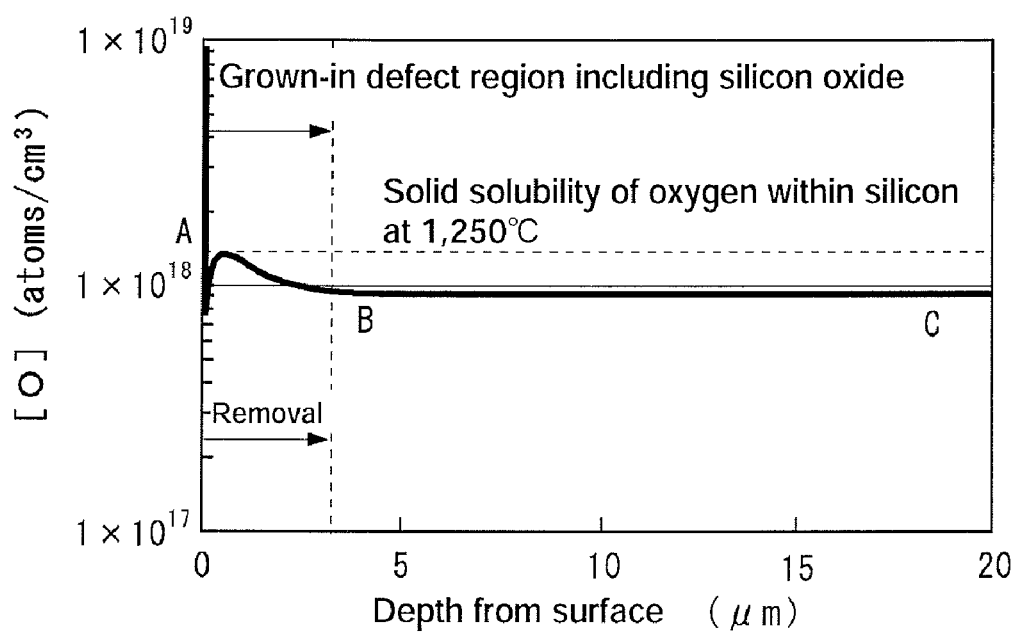
FIG. 5 is a diagram schematically showing the concentration distribution of oxygen in a depth-wise direction from the surface for a silicon wafer that is subjected to an RTP and then cooled to room temperature in an oxidizing atmosphere.

FIG. 5 is a diagram schematically showing the concentration distribution of oxygen in a depth-wise direction from the surface for a silicon wafer that is subjected to the RTP and then cooled to room temperature in an oxidizing atmosphere. In FIG. 5, the vertical axis represents the oxygen concentration, and the horizontal axis shows the depth from the surface of a wafer. The broken line parallel to the horizontal axis represents the solid solubility of oxygen within silicon at 1,250° C. and corresponds to $14 \times 10^{17}$ atoms/cm$^3$ in terms of oxygen concentration. The concentration distribution of the oxygen indicated by a solid line in the drawing shows an example of a wafer in which the oxygen concentration [Oi] inside the silicon (wafer bulk) is $9.1 \times 10^{17}$ atoms/cm$^3$.

In this example, in the range indicated by symbols B and C, by performing the RTP in an oxidizing atmosphere, the $SiO_2$ within the crystal defects such as OSF nuclei and oxygen precipitate nuclei in the PV region is completely melted and the residual vacancies are buried with interstitial silicon thereby vanishing and removing the crystal defects. When the oxygen concentration of the wafer is high, the processing temperature of the RTP is raised to the temperature where the oxygen solid solubility is higher than the oxygen concentration of the wafer, and thereby most of the $SiO_2$ within the crystal defects is melted and the vacancies within the crystal defect are buried with the interstitial silicon. Therefore, the crystal defect is remarkably reduced.

On the other hand, since oxygen is injected into the wafer surface, excessive oxygen exists in the range indicated by symbols A and B even after high temperature processing, and the oxygen amount becomes closer to the solid solubility of oxygen in silicon at 1,250° C. Therefore, the melting of the $SiO_2$ within the crystal defects is hindered, and as a result, grown-in defects including silicon oxides remain in the vicinity of the wafer surface layer. Additionally, in FIG. 5, the part in which the oxygen concentration is higher than that of the wafer bulk (region between symbols A and B) is the range where grown-in defects including silicon oxides remain.

The oxidizing atmosphere preferably has 100% of oxygen in order to facilitate the removal effect of the $SiO_2$ in the crystal defect. However, the atmosphere is not limited thereto and may be, for example, a mixed gas atmosphere of oxygen and an inert gas, containing 1% or more of oxygen.

The reason why the RTP temperature is set at 1,250° C. or more is that the effect on vanishing/removing or reducing the above crystal defects is not sufficient under the processing temperature less than 1,250° C. The upper limit of the processing temperature is preferably 1,400° C., since the wafer is melted if the temperature exceeds the melting point of silicon (1,410° C.).

The above RTP time is a duration time at a predetermined processing temperature (1,250° C. or more). The reason why this processing time is set at 10 sec or more is that the removal effect of the crystal defects is insufficient if the time is shorter than 10 sec. The upper limit of the processing time is preferably 60 sec from the viewpoint of reducing slip dislocation occurrence, although it also depends on the processing temperature.

Moreover, the temperature raising and lowering rate in the above RTP is set in the range of 10° C./sec to 300° C./sec. In case of less than 10° C./sec, productivity decreases notably, and 300° C./sec is heating limitation of the current RTP apparatus. The temperature change rate is preferably suppressed within 150° C./sec from the viewpoint of suppressing slip dislocation occurrence to a wafer. In this RTP, it is preferable to use a lamp anneal furnace that can rapidly raise and lower the temperature. This is because the temperature is rapidly raised and lowered, and the processing is performed without giving an excessive amount of heat to a wafer.

(d) Step of Removing a Grown-In Defect Region Including Silicon Oxides in the Vicinity of Wafer Surface Layer The grown-in defect region including silicon oxides near the wafer surface layer after the RTP are to be removed. This is because the RTP is carried out in an oxidizing atmosphere and oxygen is abundant on the wafer surface, so excessive oxygen exists, and the oxygen amount becomes closer to the solid solubility of oxygen in silicon at 1,250° C. Therefore, the melting of $SiO_2$ within the crystal defects is hindered, and as a result, silicon oxides remain in the vicinity of the wafer surface layer. In FIG. 5, the region between symbols A and B in which the oxygen concentration is higher than that in the wafer bulk is a distance where the grown-in defects including silicon oxides remain. As shown in the drawing, a depth/distance for removal is the region between symbols A and B.

The depth for removal of the grown-in defect region including silicon oxides near the wafer surface layer may generally be 3 µm or more. However, when the RTP temperature is high and the processing time is long, and also when the oxygen concentration in its atmosphere is high, the depth/thickness for removal is preferably set at 5 µm or more since the depth of oxygen diffusion is deep and the existence region of grown-in defects including remnant silicon oxides is deep.

The grown-in defect region including silicon oxides near the surface layer is removed by a machining process or a chemical reaction process. Any method is applicable if it permits the removal of the grown-in defect region including silicon oxides in such a manner that the processing-incurred damage can be minimized so as not to affect the flatness of the wafer. Although grinding, polishing, etc. may be adopted as a machining process, the polishing is preferable from the viewpoint of minimizing processing-incurred damage. In addition, though acid etching, alkaline etching, or the like may be adopted as a chemical reaction process, it is preferable to adopt an etching method which enables the flatness of a wafer to be maintained and not to lower the surface roughness, for example, a method in which alkaline etching is followed by acid etching wherein a depth for etching in the alkaline etching is larger than that in the acid etching.

In the method for producing a silicon wafer according to the present invention, the density of the grown-in defects including silicon oxides is preferably reduced to $1 \times 10^6$ defects/cm$^3$ or less in the entire region in a thickness-wise direction of a silicon wafer. This can reduce adverse influence by the grown-in defects on the device characteristics and greatly improve the yield of the device.

The range in depth/thickness for reducing the density of the grown-in defects may not be the entire region in a thickness-wise direction of the silicon wafer, but may be in the range between the surface of the silicon wafer and a depth of 10 µm from the surface. Within this range, the density of the grown-in defects including silicon oxides is reduced to $1 \times 10^6$ defects/cm$^3$ or less, thereby adverse influence by the grown-in defects on the device characteristic can be reduced for the range in depth generally used as a device active area, thereby securing reliability as a starting material.

In the method for producing the silicon wafer of the present invention, the interstitial oxygen concentration of the silicon wafer before the RTP in the oxidizing atmosphere is preferably set in the range of $8 \times 10^{17}$ to $20 \times 10^{17}$ atoms/cm$^3$.

The reason why the interstitial oxygen concentration is set at $8 \times 10^{17}$ atoms/cm$^3$ or more is that if the oxygen concentration is lower than that, the mechanical strength of the wafer itself is lowered, which may generate slip dislocations, etc. in the wafer during the RTP. In addition, it narrows the control width of V/G in the case where V/G is controlled so as to pull the single crystal silicon ingot consisting of the defect-free regions free of COPs and dislocation clusters.

The reason why the interstitial oxygen concentration is set at $20 \times 10^{17}$ atoms/cm$^3$ or less is that if the oxygen concentration is higher than $20 \times 10^{17}$ atoms/cm$^3$, unless the heat treatment at a high temperature of not less than the melting point of silicon is applied, it is not possible to vanish the grown-in defects including silicon oxides.

In the method for producing the silicon wafer of the present invention, it is more preferable to lower the upper limit of the interstitial oxygen concentration of the silicon wafer before the RTP performed in an oxidizing atmosphere to thereby be set in the range of $8 \times 10^{17}$ to $14 \times 10^{17}$ atoms/cm$^3$ for assuredly vanishing the grown-in defects including silicon oxides. This is because if the oxygen concentration is higher than $14 \times 10^{17}$ atoms/cm$^3$, OSF may become overt in the form of a ring.

If the silicon wafer produced by the method for producing the silicon wafer of the present invention as described above is subjected to a heat treatment that deposits oxygen precipitates (BMDs: bulk micro defects) in the silicon wafer bulk, a silicon wafer containing both a defect-free region on the wafer surface and the BMDs in the wafer bulk is obtained.

According to the method for producing a silicon wafer of the present invention, it is possible to produce a silicon wafer that, as well as being free of COPs and dislocation clusters, has the grown-in defects including silicon oxides, which are not overt in an as-grown state, such as the OSF nuclei and oxygen precipitate nuclei existing in the PV region, to be vanished or reduced.

The silicon wafer of the present invention is cut out of a single crystal silicon ingot, grown by the CZ method, that as well as being free of COPs and dislocation clusters, has the grown-in defects including silicon oxide to be reduced. This wafer can be produced by the method of producing a silicon wafer of the present invention as described above.

If a silicon wafer cut out of the above single crystal silicon ingot preferably consists of defect-free regions as being free of COPs and dislocation clusters, the silicon wafer of the present invention contains extremely few crystal defects, including the grown-in defects having silicon oxides.

In the silicon wafer of the present invention, the density of the grown-in defects including silicon oxides is preferably $1 \times 10^6$ defects/cm$^3$ or less in the entire region in a thickness-wise direction of the silicon wafer. In this wafer, the grown-in defects are significantly reduced in the entire area in a thickness-wise direction, so the wafer exerts little adverse influence on the device characteristic and can cope with the case where the device active area is deeper than usual. When being not in the entire region in a thickness-wise direction of the wafer, as far as the density of the grown-in defects including silicon oxides within the range in depth between the wafer surface and a depth of 10 μm from the surface is $1 \times 10^6$ defects/cm$^3$ or less, the above grown-in defects are significantly reduced within the region typically used as the device active area, so the adverse effect on the device characteristics is small.

Additionally, in the silicon wafer of the present invention, it is more preferable that the interstitial oxygen concentration of the silicon wafer is in the range of $8 \times 10^{17}$ to $20 \times 10^{17}$ atoms/cm$^3$. This wafer is reduced in grown-in defects including silicon oxides and excellent in mechanical strength. Moreover, since the silicon wafer has a sufficient oxygen concentration, when DZ-IG processing is applied in a device step, a defect-free region is formed in the wafer surface layer and BMD functioning as a gettering site is formed in the bulk, and thereby the wafer can be appropriately used as a substrate for a device. Further, the silicon wafer of the present invention more preferably has an oxygen concentration from $8 \times 10^{17}$ to $14 \times 10^{17}$ atoms/cm$^3$. Since there is no fear that the OSF may become overt in the form of a ring in this wafer as mentioned above, this wafer has much excellent reliability as a starting material.

EXAMPLES

A wafer consisting of defect-free regions was subjected to an RTP in an oxidizing atmosphere, and the wafer after this processing was examined for the density of the grown-in defects including silicon oxides. For comparison, a wafer subjected to the RTP in an Ar gas atmosphere and a wafer without the RTP were similarly examined.

A wafer used for the examination was cut out of a single crystal silicon ingot consisting of defect-free regions as being free of COPs and dislocation clusters, which is grown by the CZ method. Two classes of wafers that have interstitial oxygen concentrations of $12.0 \times 10^{17}$ atoms/cm$^3$ (wafer level 1) and $9.1 \times 10^{17}$ atoms/cm$^3$ (wafer level 2) respectively were used.

A lamp anneal furnace was used for the RTP, and an atmosphere of 100% of oxygen or 100% of Ar (Comparative Example) is maintained in the furnace. The processing temperature and duration time were each 1,250° C. and 10 seconds.

In the vicinity of the wafer surface layer after the RTP, grown-in defects including silicon oxides remain and therefore this grown-in defect region including silicon oxides should be removed. Hence, for each of Inventive Examples and Comparative Examples, a total of 10 μm as polishing allowance is taken off by mirror-polishing both surfaces of the wafer (5 μm for each surface) to thereby remove the grown-in defect region including silicon oxides.

The density of grown-in defects including silicon oxides was examined as follows: the wafer after the RTP and mirror-polishing which removed the grown-in defect region including silicon oxides in the vicinity of the wafer surface layer was charged into a reactive ion etcher, and it was etched to a depth of about 5 μm in a setting wherein the selection ratio of Si/SiO2 was 100 or more in an atmosphere of a mixed gas of HBr/Cl2/He+O2. The sample after the reactive ion etching was washed with a hydrofluoric acid to remove the reaction product adhered to the sample during the reactive ion etching, and the etched surface was observed by means of a light microscope to calculate the density of the grown-in defects including silicon oxides.

The examination results are shown in Table 1.

TABLE 1

| | | Inventive Example RTP 1250° C. × 10 sec 100% oxygen atmosphere | Comparative Example 1 RTP 1250° C. × 10 sec 100% Ar atmosphere | Comparative Example 2 Without RTP |
|---|---|---|---|---|
| Grown-in defects including silicon oxides (defects/cm$^3$) | Wafer level 1 | $9 \times 10^5$ | $1 \times 10^7$ to $2 \times 10^7$ | $5 \times 10^7$ to $8 \times 10^7$ |
| | Wafer level 2 | $<6.1 \times 10^4$ | $1 \times 10^7$ | $2 \times 10^7$ to $3 \times 10^7$ |

As is obvious from Table 1, when the RTP was performed in an Ar gas atmosphere (Comparative Example 1), and when the RTP was not carried out (Comparative Example 2), the density of the grown-in defects including silicon oxides was in the range between $1 \times 10^7$ and $8 \times 10^7$ defects/cm$^3$. However, when the RTP was performed in an oxidizing atmosphere, the density was significantly reduced to $9 \times 10^5$ defects/cm$^3$ or less. When the wafer level 1 and wafer level 2, being different in oxygen concentration from each other, are compared with each other, the wafer level 2 having lower oxygen concentration is lower in the grown-in defects including silicon oxides.

The above examination ascertained that the application of the RTP in an oxidizing atmosphere to the wafer containing the grown-in defects including silicon oxides makes it possible to significantly reduce the grown-in defects.

According to the method of producing a silicon wafer of the present invention, it is possible to produce a silicon wafer that as well as being free of COPs and dislocation clusters, has the grown-in defects including silicon oxides, which are not overt in an as-grown state, such as the plate-like oxygen precipitates (OSF nuclei) existing in the OSF region and the oxygen precipitate nuclei existing in the PV region, to be significantly reduced.

Since the silicon wafer of the present invention produced by this method has extremely few grown-in defects including silicon oxides, the silicon wafer may not exert adverse effects such as a device characteristic defective, when the wafer is used as a substrate of a semiconductor device. Therefore, the silicon wafer is suitable for a substrate of a device, etc.

Thus, the present invention can be widely utilized in the production of silicon wafers and semiconductor devices.

What is claimed is:

1. A method for producing a silicon wafer, comprising the steps of:

growing a single crystal silicon ingot by the Czochralski method;

cutting a silicon wafer out of the single crystal silicon ingot;

subjecting the silicon wafer to a rapid thermal processing (RTP) at 1,250° C. or more for 10 seconds or more in an oxidizing atmosphere; and removing a grown-in defect region that includes silicon oxides remaining in the vicinity of wafer surface layer and has an increased oxygen concentration much more than that in the wafer bulk portion after the RTP.

2. The method for producing a silicon wafer according to claim 1, wherein the interstitial oxygen concentration of the silicon wafer before the RTP in the oxidizing atmosphere is set in the range of $8\times10^{17}$ to $20\times10^{17}$ atoms/cm$^3$.

3. The method for producing a silicon wafer according to claim 1, wherein the interstitial oxygen concentration of the silicon wafer before the RTP in the oxidizing atmosphere is set in the range of $8\times10^{17}$ to $14\times10^{17}$ atoms/cm$^3$.

4. The method for producing a silicon wafer according to claim 1, wherein the grown-in defect region is removed by grinding or polishing.

5. The method for producing a silicon wafer according to claim 1, wherein the depth of removal of the grown-in defect region is not less than 3 μm.

6. The method for producing a silicon wafer according to claim 1, wherein the depth of removal of the grown-in defect region is not less than 5 μm.

* * * * *

UNITED STATES PATENT AND TRADEMARK OFFICE
CERTIFICATE OF CORRECTION

PATENT NO. : 8,231,852 B2  
APPLICATION NO. : 12/779968  
DATED : July 31, 2012  
INVENTOR(S) : Itou et al.

Page 1 of 1

It is certified that error appears in the above-identified patent and that said Letters Patent is hereby corrected as shown below:

In the Claims

Column 14, Line 9  
In the last line of claim 1 after "RTP" insert --; wherein the single crystal silicon ingot as being free of COPs and dislocation clusters is grown in said growing step; and wherein the density of the grown-in defects including silicon oxides is reduced to $1 \times 10^6$ defects/cm$^3$ or less in the entire region in a thickness-wise direction of the silicon wafer after the removing step.--

Signed and Sealed this  
Thirteenth Day of August, 2013

Teresa Stanek Rea  
*Acting Director of the United States Patent and Trademark Office*